(12) United States Patent
Ueno (10) Patent No.: US 10,734,994 B2
(45) Date of Patent: Aug. 4, 2020

(54) GATE CONTROL CIRCUIT, POWER SUPPLY CIRCUIT, AND INVERTER CIRCUIT

(71) Applicant: KABUSHIKI KAISHA TOSHIBA, Minato-ku (JP)

(72) Inventor: Takeshi Ueno, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/286,645

(22) Filed: Feb. 27, 2019

(65) Prior Publication Data

US 2020/0083884 A1 Mar. 12, 2020

(30) Foreign Application Priority Data

Sep. 6, 2018 (JP) .................................. 2018-167201

(51) Int. Cl.
*H03K 17/687* (2006.01)

(52) U.S. Cl.
CPC .................................. *H03K 17/687* (2013.01)

(58) Field of Classification Search
CPC .. H03K 17/687; H03K 17/0822; H03K 17/18; H03K 17/042; H03K 3/037; H03K 5/14; H03K 5/24; H03K 7/08

USPC ...................... 327/108, 9, 110, 111, 112, 365
See application file for complete search history.

(56) References Cited

U.S. PATENT DOCUMENTS 6,057,728 A * 5/2000 Igarashi ............. H03K 17/0828
327/546
9,496,866 B2 11/2016 Masaoka

FOREIGN PATENT DOCUMENTS

JP 2016-59172 4/2016

\* cited by examiner

*Primary Examiner* — John W Poos
(74) *Attorney, Agent, or Firm* — Oblon, McClelland, Maier & Neustadt, L.L.P.

(57) ABSTRACT

A gate control circuit includes: a transition time detection circuit configured to detect a transition time of a drain voltage of a switching transistor that is turned ON or OFF by a gate voltage corresponding to a first pulse signal and a second pulse signal; an error detection circuit configured to output an error voltage representing a difference between the transition time and a target transition time being predetermined; and a transition time control circuit configured to generate the second pulse signal on the basis of the error voltage and the first pulse signal corresponding to an input signal that instructs ON or OFF of the switching transistor.

20 Claims, 9 Drawing Sheets

GATE CONTROL CIRCUIT, POWER SUPPLY CIRCUIT, AND INVERTER CIRCUIT

CROSS REFERENCE TO RELATED APPLICATIONS

This application is based upon and claims the benefit of priority from the prior Japanese Patent Application No. 2018-167201, filed on Sep. 6, 2018, the entire contents of which are incorporated herein by reference.

FIELD

Embodiments of the present invention relate to a gate control circuit, a power supply circuit, and an inverter circuit.

BACKGROUND

Circuits using transistors that perform switching operation, such as converters, inverters, and power factor correction circuits become a generation source of noise since the switching operation suddenly changes a voltage. A generation amount of noise depends on a slew rate of a drain voltage of the transistor. In order to inhibit noise, it is common to insert a resistor in series into a gate terminal of the transistor, and decrease a change of a gate voltage to suppress the slew rate of the drain voltage.

However, there is a problem that reducing the slew rate of the drain voltage increases switching loss. The slew rate also depends on a load current, an element temperature, element variation, and the like. Therefore, when a value of gate resistance is set such that noise does not exceed a predetermined value under any operating conditions, the slew rate becomes significantly smaller than the predetermined value in many periods, causing a state where switching loss occurs more than necessary.

In order to solve such a problem, it is sufficient to observe the slew rate of the drain voltage, that is, a transition time, and adjust a gate drive signal such that a change amount becomes a predetermined value. For example, a method has been proposed in which a rise time of a drain voltage is detected, and a difference between the detected rise time and a target time is fed back to a drive circuit of an FET. However, no specific method for generating a gate drive signal of the FET has been proposed. Therefore, it is not possible to adjust the slew rate of the drain voltage to the target value.

DETAILED DESCRIPTION

According to the present embodiment, there is provided a gate control circuit including:

a transition time detection circuit configured to detect a transition time of a drain voltage of a switching transistor that is turned ON or OFF by a gate voltage corresponding to a first pulse signal and a second pulse signal;

an error detection circuit configured to output an error voltage representing a difference between the transition time and a predetermined target transition time; and a transition time control circuit configured to generate the second pulse signal on the basis of the error voltage and the first pulse signal corresponding to an input signal that instructs ON or OFF of the switching transistor.

An embodiment of the present invention is described below with reference to drawings. In the following embodiments, a characteristic configuration and an operation of a gate control circuit, a power supply circuit, and an inverter circuit will be mainly described, but the gate control circuit, the power supply circuit, and the inverter circuit may have configurations and operations omitted in the following description.

First Embodiment

Figure 1:
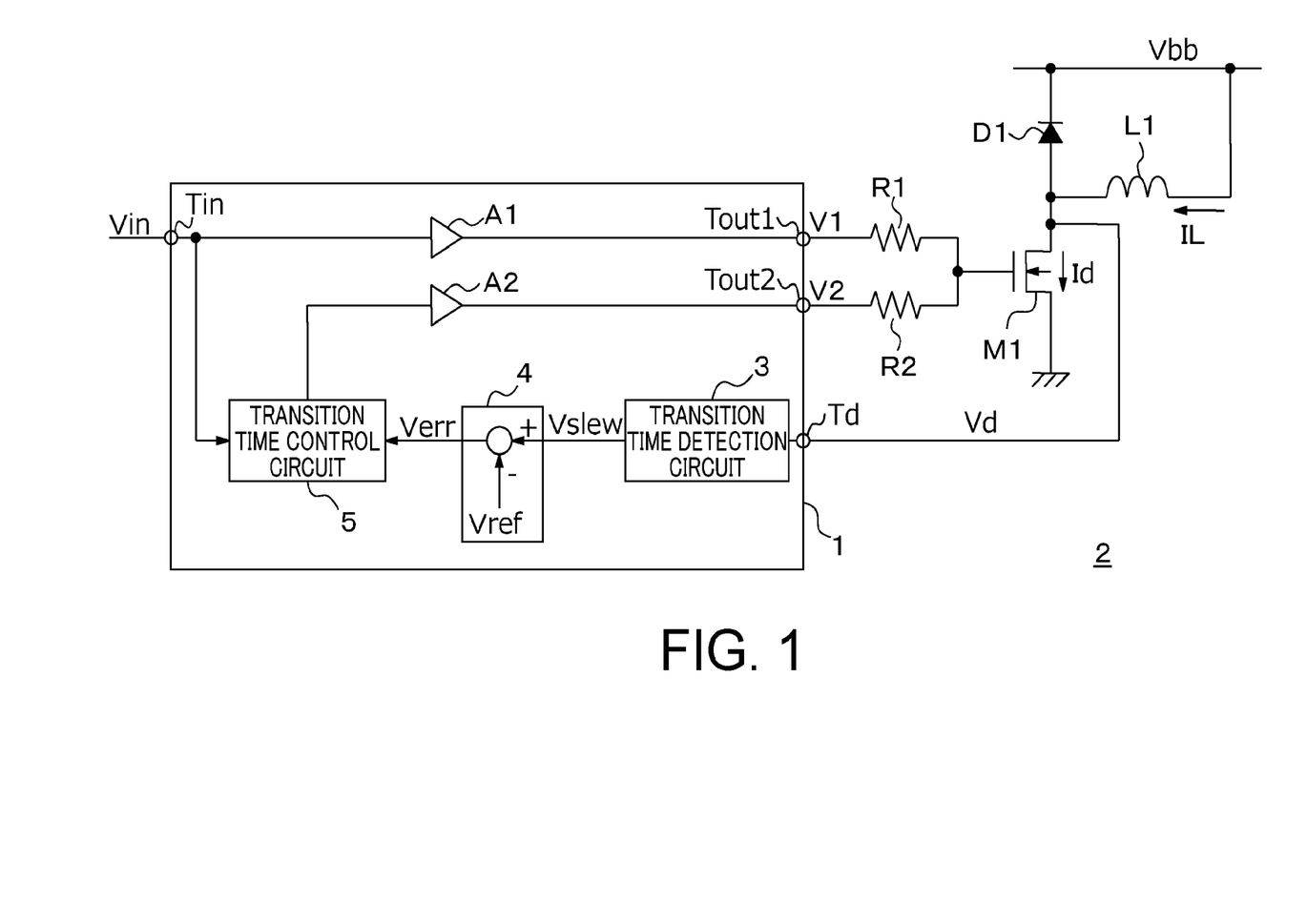
FIG. 1 is a block diagram showing a schematic configuration of a power supply circuit including a gate control circuit according to a first embodiment.

FIG. 1 is a block diagram showing a schematic configuration of a power supply circuit 2 including a gate control circuit 1 according to a first embodiment. The power supply circuit 2 in FIG. 1 includes the gate control circuit 1, a first resistance element R1 and a second resistance element R2, a switching transistor M1, and a diode D1. The switching transistor M1 drives a load such as a motor. The switching transistor M1 may be a power factor improving circuit, for example, and may be a part of a main circuit of the power supply circuit 2. In FIG. 1, a load is represented by a symbol of an inductor L1. The switching transistor M1 is, for example, an N-type MOS transistor. Note that the switching transistor M1 may be an N-type IGBT, but an example will be described in which the switching transistor M1 is an N-type MOS transistor, in the following description.

A load current flowing through the load L1 flows to the diode D1 when the switching transistor M1 is OFF, and flows between a drain and a source of the switching transistor M1 when the switching transistor M1 is ON. In FIG. 1, the switching transistor M1 is disposed on a low side while the diode D1 is disposed on a high side. However, this is merely an example, and the circuit configuration around the switching transistor M1 is not limited to that shown in FIG. 1. In the example of FIG. 1, an anode of the diode D1 is connected to the drain of the switching transistor M1 and one end of the inductor L1, while a bus voltage Vbb node is connected to a cathode of the diode D1 and another end of the inductor L1.

The gate control circuit 1 of FIG. 1 includes a transition time detection circuit 3, an error detection circuit 4, and a transition time control circuit 5. In addition, the gate control circuit 1 of FIG. 1 may include a first buffer amplifier A1 configured to generate a first pulse signal V1 from an input signal Vin that instructs ON or OFF of the switching transistor M1, and a second buffer amplifier A2 configured to generate a second pulse signal V2 from an output signal of the transition time control circuit 5. Further, the gate control circuit 1 of FIG. 1 includes: a first terminal Tin to which the input signal Vin is inputted; a second terminal Tout1 from which the first pulse signal V1 is outputted; a third terminal Tout2 from which the second pulse signal V2 is outputted; and a fourth terminal Td to which a drain voltage of the switching transistor M1 is inputted.

Between the second terminal Tout1 and the third terminal Tout2, the first resistance element R1 and the second resistance element R2 are connected in series, and a connection node of the resistance elements R1 and R2 is connected to a gate of the switching transistor M1. This causes a gate voltage of the switching transistor M1 to become a voltage corresponding to the first pulse signal V1 and the second pulse signal V2.

The transition time detection circuit 3 detects a transition time of a drain voltage of the switching transistor M1. The transition time of the drain voltage is a time for the drain voltage to become a ground voltage from the bus voltage Vbb when the switching transistor M1 transitions from OFF to ON. The error detection circuit 4 outputs an error voltage Verr representing a difference between the transition time and a predetermined target transition time.

Figure 4:
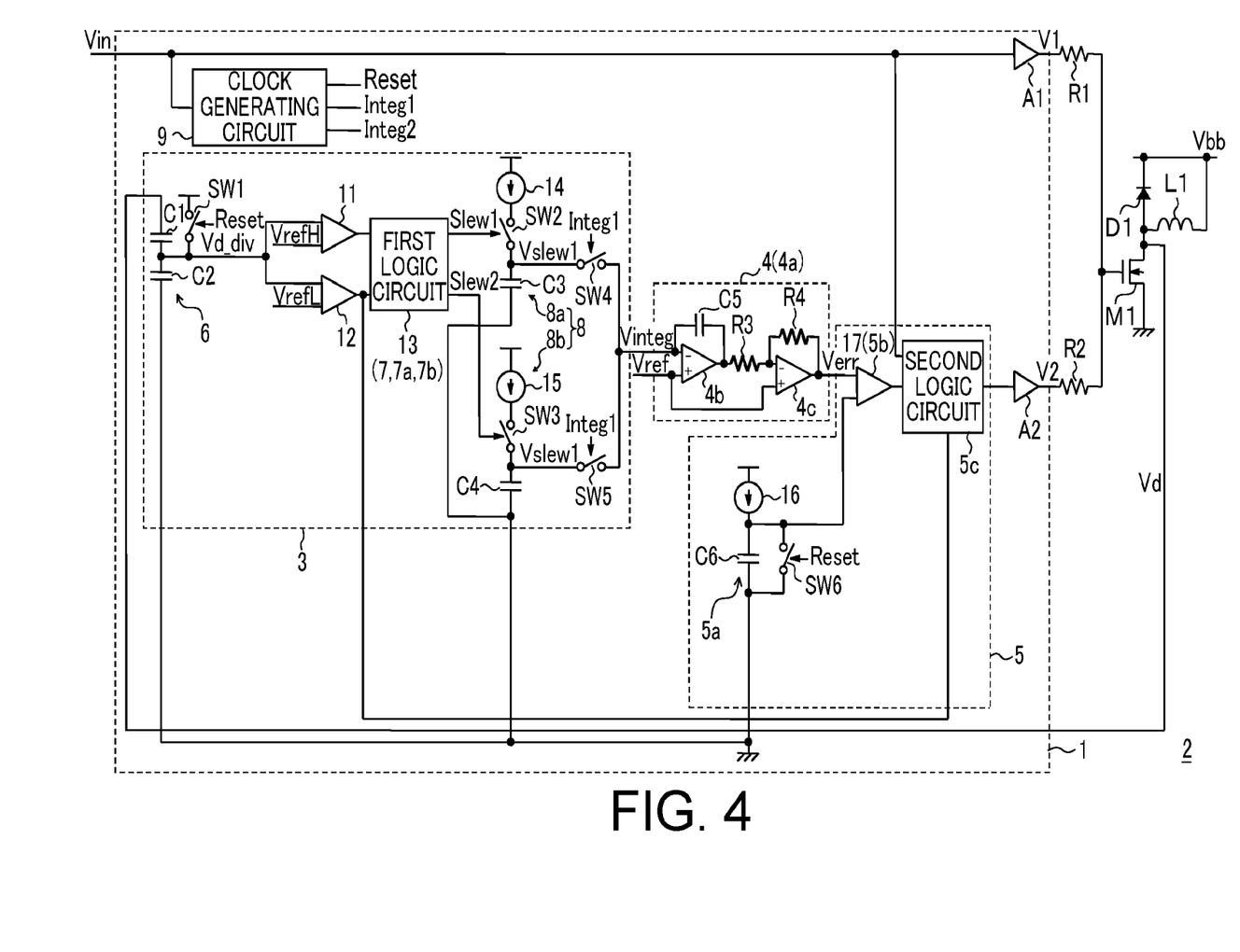
FIG. 4 is a circuit diagram of a power supply circuit including a gate control circuit according to a third embodiment.

As shown in FIG. 4 to be described later, the transition time detection circuit 3 may include a voltage dividing circuit 6, a pulse generating circuit 7, and a time-voltage conversion circuit 8. The voltage dividing circuit 6 divides a drain voltage Vd of the switching transistor M1 by, for example, a capacitance ratio of a plurality of capacitors. The pulse generating circuit 7 outputs a pulse signal indicating that a divided voltage Vd_div outputted from the voltage dividing circuit 6 is within a predetermined voltage range. The time-voltage conversion circuit 8 outputs a voltage corresponding to a pulse width of the pulse signal. In this case, the error detection circuit 4 outputs an error voltage Verr corresponding to a difference between the voltage outputted from the time-voltage conversion circuit 8 and a reference voltage corresponding to the target transition time. The error detection circuit 4 is also called an error amplifier 4a.

As shown in FIG. 4 to be described later, the pulse generating circuit 7 may include a first transition detection unit 7a and a second transition detection unit 7b. When the first pulse signal V1 outputs an odd-numbered pulse signal, the first transition detection unit 7a outputs a first transition detection signal indicating that an output voltage of the voltage dividing circuit 6 is within a predetermined voltage range. When the first pulse signal V1 outputs an even-numbered pulse signal, the second transition detection unit 7b outputs a second transition detection signal indicating that an output voltage of the voltage dividing circuit 6 is within a predetermined voltage range.

As shown in FIG. 4 to be described later, the time-voltage conversion circuit 8 may include a first time-voltage conversion circuit 8a and a second time-voltage conversion circuit 8b. The first time-voltage conversion circuit 8a outputs a first voltage corresponding to a pulse width of the first transition detection signal. The second time-voltage conversion circuit 8b outputs a second voltage corresponding to a pulse width of the second transition detection signal. In this case, the error detection circuit 4 outputs an error voltage Verr corresponding to a difference between the first and the second voltages and the reference voltage.

The transition time control circuit 5 generates the second pulse signal V2 on the basis of the error voltage Verr and the first pulse signal V1 corresponding to the input signal Vin. The transition time control circuit 5 controls, in accordance with the error voltage Verr, the timing for causing the second pulse signal V2 to fall for the first time after raising the second pulse signal V2 in synchronization with a rising edge of the first pulse signal V1. The transition time control circuit 5 may control, in accordance with the drain voltage Vd, the timing for raising the second pulse signal V2 for the second time after causing the second pulse signal V2 to fall for the first time.

As shown in FIG. 4 to be described later, the transition time control circuit 5 may include a sawtooth voltage generation circuit 5a, a first timing detection circuit 5b, and a second logic circuit 5c. The sawtooth voltage generation circuit 5a outputs a sawtooth voltage. The first timing detection circuit 5b detects the timing at which the error voltage Verr coincides with the sawtooth voltage. The second logic circuit 5c determines the timing at which the second pulse signal V2 falls on the basis of the timing at which the error voltage Verr coincides with the sawtooth voltage.

Figure 2:
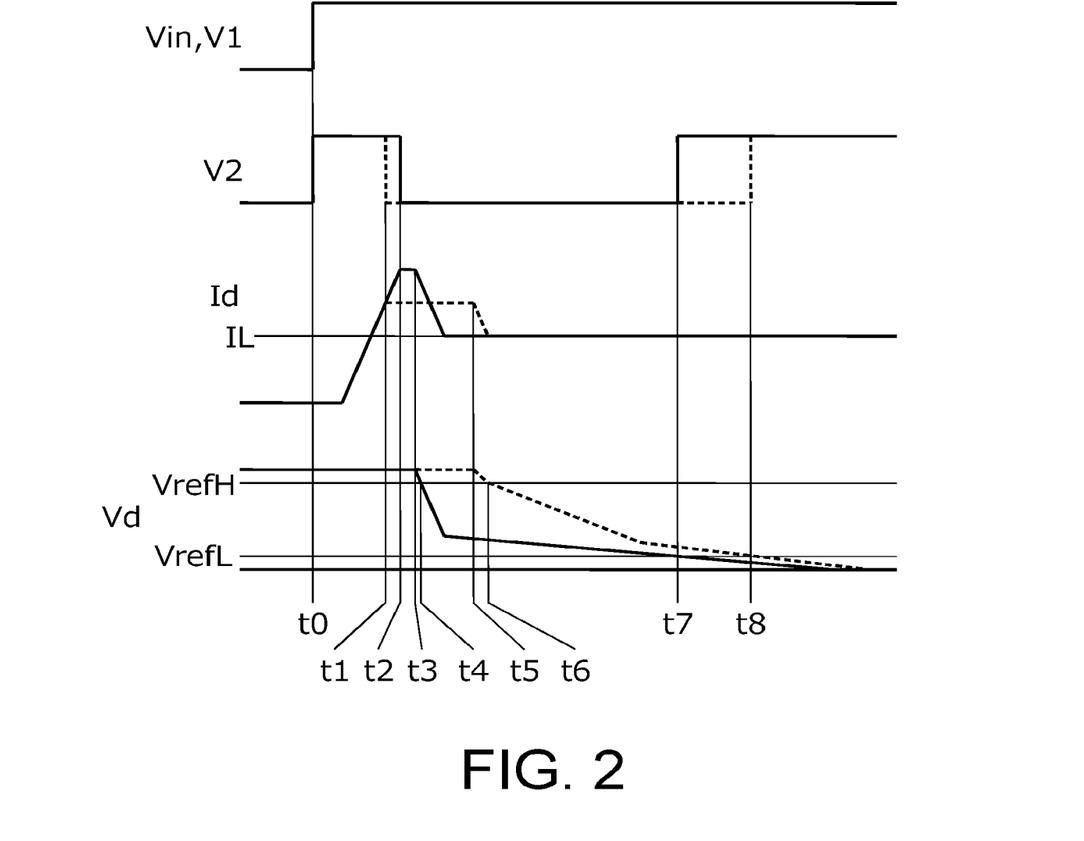
FIG. 2 is a timing chart of the gate control circuit according to the first embodiment.

FIG. 2 is a timing chart of the gate control circuit 1 according to the first embodiment. Hereinafter, an operation of the gate control circuit 1 of FIG. 1 will be described with reference to FIG. 2.

At a time t0, when the input signal Vin and the first pulse signal V1 rise from low to high, the transition time control circuit 5 raises the second pulse signal V2 from low to high. This increases a gate voltage of the switching transistor M1, and accordingly, a drain current of the switching transistor M1 starts to increase. A voltage level of the input signal Vin is about 0 to 5 V, which is an operation voltage of the transition time control circuit 5 (the second logic circuit 5c), while a voltage level of the first pulse signal V1 is about 0 to 10V, which is a voltage suitable for driving the switching transistor M1.

Since the first pulse signal V1 and the second pulse signal V2 both become high at the time t0 in this way, the gate voltage of the switching transistor M1 starts to increase and the drain current starts to increase, and the drain voltage Vd starts to decrease.

The transition time detection circuit 3 observes the drain voltage Vd of the switching transistor M1. At a time t2, the transition time control circuit 5 causes transition of the second pulse signal V2 to low. By making a resistance value of the first resistance element R1 larger than a resistance value of the second resistance element R2, the gate current of the switching transistor M1 greatly decreases from the time t2, and an increase of a drain current Id is suppressed. Here, when the drain current Id exceeds the current of the inductor L1, the diode D1 on the high side is brought to a reverse recovery state, and accumulated charges in the diode D1 are discharged for a while.

At the same time that the reverse recovery current of the diode D1 decreases, the drain current Id and the drain voltage Vd start to decrease (a solid line waveform in FIG. 2).

Here, it is assumed that the transition time control circuit 5 causes transition of the second pulse signal V2 to low at a time t1 before the time t2. In this case, as shown by a broken line waveform in FIG. 2, a peak of the drain current Id is suppressed, and a period during which the peak value of the drain current Id is maintained becomes longer (the time t2 to t5). After the time t5, the drain current Id starts to decrease. A decrease amount of the drain current Id after the time t5 is smaller than the solid line waveform. Therefore, a rate at which the drain voltage Vd decreases (the broken line waveform) is smaller than the solid line waveform, and the slew rate of the drain voltage Vd becomes small.

Here, a target slew rate of the drain voltage Vd is defined as a time that the drain voltage Vd transitions from VrefH to VrefL. For example, VrefH is 90% of the main circuit bus voltage Vbb, and VrefL is 10% of the main circuit bus voltage Vbb. When the transition time of the drain voltage Vd is longer than the target time, that is, when the slew rate of the drain voltage Vd is lower than the target slew rate, the error voltage Verr outputted from the error detection circuit 4 becomes positive. On the other hand, when the transition time of the drain voltage Vd is shorter than the target time, the error voltage Verr outputted from the error detection circuit 4 becomes negative.

When the error voltage Verr is positive, the transition time control circuit 5 delays the timing at which the second pulse signal V2 transitions from high to low for the first time. Further, when the error voltage Verr is negative, the transition time control circuit 5 advances the timing at which the second pulse signal V2 transitions from high to low for the first time.

When the drain voltage Vd becomes lower than VrefL, the transition time control circuit 5 causes transition of the second pulse signal V2, which has once been changed to low, to high. Note that it is not indispensable to cause the transition of the second pulse signal V2 to high after the drain voltage Vd becomes lower than VrefL. However, by causing the transition of the second pulse signal V2 to high, the gate of the switching transistor M1 is driven with low impedance, which is more desirable.

In this way, the gate control circuit 1 of FIG. 1 controls a gate voltage of the switching transistor M1 in accordance with the first pulse signal V1 and the second pulse signal V2, and adjusts the timing at which the second pulse signal V2 transitions from high to low for the first time in accordance with the transition time of the drain voltage Vd of the switching transistor M1. This enables the gate voltage to be adjusted in accordance with the drain voltage Vd of the switching transistor M1, and enables the slew rate of the drain voltage Vd to be controlled to a desired value.

Second Embodiment

In the gate control circuit 1 according to the first embodiment, the timing at which the second pulse signal V2 transitions to high for the second time is irrelevant to the transition time of the drain voltage Vd. On the other hand, a gate control circuit 1 according to a second embodiment fixes the timing at which a second pulse signal V2 transitions first (for the first time) to low, and controls the timing at which the second pulse signal V2 transitions to high for the second time in accordance with a transition time of a drain voltage Vd.

The gate control circuit 1 according to the second embodiment has a block configuration similar to that in FIG. 1, but an operation of a transition time control circuit 5 is different from that in FIG. 1. The transition time control circuit 5 according to the present embodiment causes transition of the second pulse signal V2 to high in synchronization with a rising edge of a first pulse signal V1, then causes transition of the second pulse signal V2 to low for the first time after a lapse of a predetermined period, and then controls the timing at which the second pulse signal V2 transitions to high for the second time in accordance with an error voltage Verr.

Figure 3:
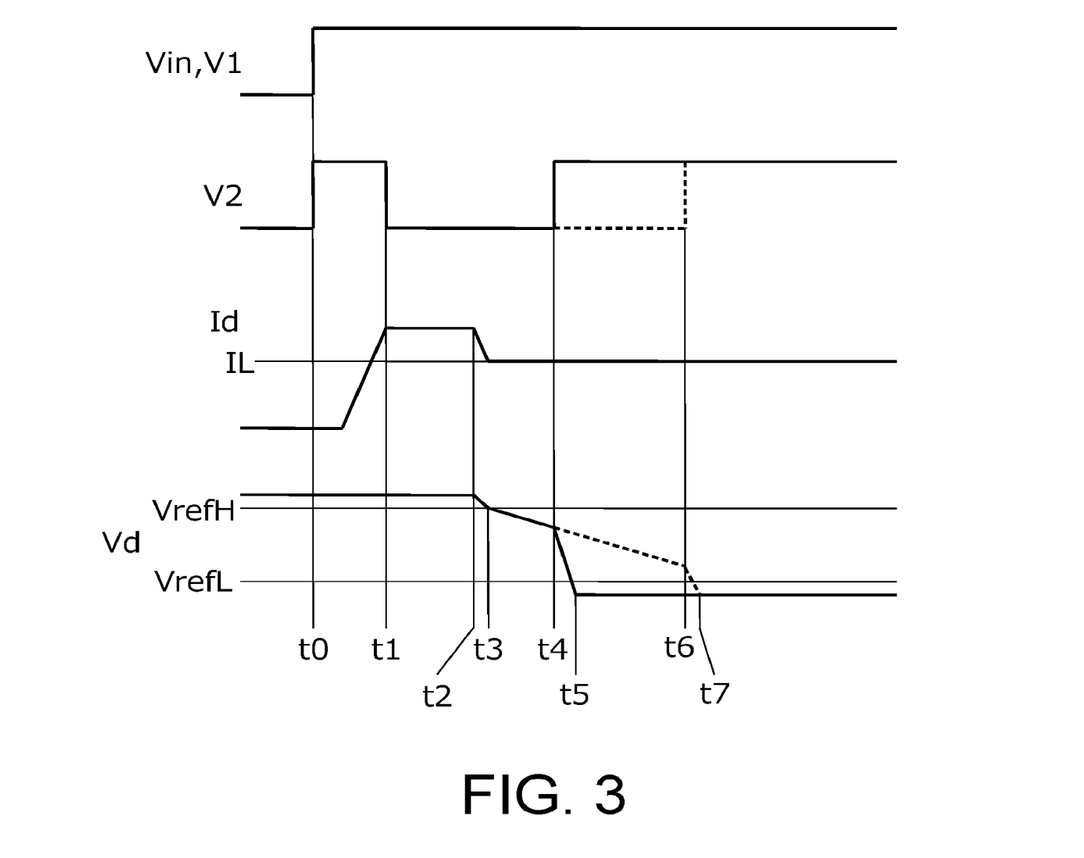
FIG. 3 is a timing chart of a gate control circuit according to a second embodiment.

FIG. 3 is a timing chart of the gate control circuit 1 according to the second embodiment. At a time t0 in FIG. 3, when an input signal Vin and the first pulse signal V1 rise from low to high, the second pulse signal V2 also rises to high. Thereafter, at a time t1 at which a predetermined specified period has elapsed, the transition time control circuit 5 causes transition of the second pulse signal V2 to low. As a result, a change of a drain current becomes gradual between the times t1 and t2, and then the drain current starts to decrease. In accordance with this, the drain voltage Vd maintains the same voltage value until the time t2, and then starts to decrease.

When the transition time control circuit 5 causes transition of the second pulse signal V2 to high at a time t4, the drain voltage Vd sharply decreases (a solid line waveform from the time t4 to t5) since a gate current increases.

On the other hand, when the transition time control circuit 5 causes transition of the second pulse signal V2 to high at a time t6 later than the time t4, since the drain voltage Vd continues to gradually decrease until reaching the time t6 (a broken line waveform from the time t4 to time t6), the drain voltage Vd decreases merely slightly even if the second pulse signal V2 transitions to high at the time t6.

As can be seen by comparing the solid waveform between the times t4 to t5 and the broken line waveform between the times t4 to t6, the time at which the drain voltage Vd transitions from VrefH to VrefL is longer between times t4 to t6 than that between times t4 to t5. Therefore, when the error voltage Verr is positive (when the slew rate of the drain voltage Vd is smaller than a target slew rate), the transition time control circuit 5 advances the timing at which the second pulse signal V2 transitions to high for the second time, whereas when the error voltage Verr is negative (when the slew rate of the drain voltage Vd is larger than the target slew rate), the transition time control circuit 5 delays the timing at which the second pulse signal V2 transitions to high for the second time.

As described above, in the second embodiment, the timing at which the second pulse signal V2 transitions from high to low for the first time is set to a predetermined specified time, and the timing at which the second pulse signal V2 transitions from low to high for the second time is controlled in accordance with the transition time of the drain voltage Vd of the switching transistor M1. This enables, similarly to the first embodiment, the slew rate of the drain voltage Vd to be adjusted to a desired value.

Third Embodiment

A gate control circuit 1 according to a third embodiment is obtained by embodying the circuit configuration of the gate control circuit 1 according to the first embodiment.

FIG. 4 is a circuit diagram of a power supply circuit 2 including the gate control circuit 1 according to the third embodiment. The gate control circuit 1 of FIG. 4 includes a transition time detection circuit 3, an error amplifier 4a corresponding to the error detection circuit 4, a transition time control circuit 5, a first buffer amplifier A1, a second buffer amplifier A2, and a clock generating circuit 9.

The clock generating circuit 9 generates a reset signal Reset and first and second period selection signals Integ1 and Integ2 in synchronization with an input signal Vin. The reset signal Reset is a signal having the same phase and frequency as the input signal Vin. The first and second period selection signals Integ1 and Integ2 are signals that become high when the input signal Vin is low once every two periods of the input signal Vin. The first period selection signal Integ1 and the second period selection signal Integ2 are shifted in phase by one period of the input signal Vin.

The transition time detection circuit 3 includes a first capacitor C1 and a second capacitor C2 connected in series, first to fifth switches SW1 to SW5, a first comparator 11, a second comparator 12, a first logic circuit 13, a first current source 14, a third capacitor C3, a second current source 15, and a fourth capacitor C4.

The first capacitor C1 and the second capacitor C2 are connected in series between a drain of a switching transistor M1 and a ground node. From a connection node of the first capacitor C1 and the second capacitor C2, a divided voltage Vd_div obtained by dividing a drain voltage Vd by a capacitance ratio of the first capacitor C1 and the second capacitor C2 is outputted. This divided voltage Vd_div is inputted to an input terminal of the first comparator 11 and an input terminal of the second comparator 12. The capacitance ratio of the first capacitor C1 and the second capacitor C2 is set such that a maximum value of the divided voltage Vd_div is equal to or less than an output voltage of the gate control circuit 1, for example, 5 V or less.

The first switch SW1 is connected between a power supply voltage node and a divided voltage node. When the reset signal Reset is low, the first switch SW1 is turned ON to short-circuit the power supply voltage node and the divided voltage node. That is, the first switch SW1 generates the divided voltage Vd_div during a period when the input signal Vin is high, and initializes the connection node of the first capacitor C1 and the second capacitor C2 to the power supply voltage (for example, 5 V) during a period when the input signal Vin is low.

The first comparator 11 outputs a signal corresponding to a differential voltage between the divided voltage Vd_div and a first reference voltage VrefH. The second comparator 12 outputs a signal corresponding to a differential voltage between the divided voltage Vd_div and a second reference voltage VrefL. On the basis of the output signal of the first comparator 11 and the output signal of the second comparator 12, the first logic circuit 13 alternately outputs signals Slew1 and Slew2 indicating a transition time until the divided voltage Vd_div decreases from the first reference voltage VrefH to the second reference voltage VrefL for each clock cycle. The signals Slew1 and Slew2 have a pulse width corresponding to the transition time.

The first comparator 11, the second comparator 12, and the first logic circuit 13 are included in a pulse generating circuit 7. Further, the first logic circuit 13 may be a first transition detection unit 7a and a second transition detection unit 7b.

Between the power supply voltage node and the ground node, the first current source 14, the second switch SW2, and the third capacitor C3 are connected in series. Similarly, between the power supply voltage node and the ground node, the second current source 15, the third switch SW3, and the fourth capacitor C4 are connected in series. The second switch SW2 is turned ON when the signal Slew1 is high, a current from the first current source 14 passes through the second switch SW2 and flows to the third capacitor C3, and charges are accumulated. The third switch SW3 is turned ON when the signal Slew2 is high, a current from the second current source 15 passes through the third switch SW3 and flows to the fourth capacitor C4, and charges are accumulated.

The first current source 14, the second switch SW2, and the third capacitor C3 are included in a first time-voltage conversion circuit 8a. The second current source 15, the third switch SW3, and the fourth capacitor C4 are included in a second time-voltage conversion circuit 8b.

The fourth switch SW4 is connected between a connection node of the second switch SW2 and the third capacitor C3, and an output node of the transition time detection circuit 3. The fifth switch SW5 is connected between a connection node of the third switch SW3 and the fourth capacitor C4, and the output node of the transition time detection circuit 3.

The fourth switch SW4 is turned ON when the first period selection signal Integ1 is high, and outputs a current corresponding to the accumulated charge of the third capacitor C3, from the output node of the transition time detection circuit 3. The fifth switch SW5 is turned ON when the second period selection signal Integ2 is high, and outputs a current corresponding to the accumulated charge of the fourth capacitor C4, from the output node of the transition time detection circuit 3.

The error amplifier 4a includes a first differential amplifier 4b, a fifth capacitor C5, a third resistance element R3, a second differential amplifier 4c, and a fourth resistance element R4. The first differential amplifier 4b outputs a signal corresponding to a differential voltage between the output voltage of the transition time detection circuit 3 and a reference voltage. The fifth capacitor C5 is connected between an inverting input node and an output node of the first differential amplifier 4b. The first differential amplifier 4b and the fifth capacitor C5 are included in an integrator.

To a non-inverting input node of the first differential amplifier 4b, a reference voltage Vref corresponding to a target transition time is inputted. Therefore, when the fourth switch SW4 is turned ON, the accumulated charge in the third capacitor C3 is transferred to the fifth capacitor C5. The charge transferred to the fifth capacitor C5 is expressed by (Vslew1−Vref)·C3. Therefore, an output voltage of the first differential amplifier 4b decreases by an amount of (Vslew1−Vref)·C3/Cinteg.

Similarly, when the fifth switch SW5 is turned ON, the accumulated charge in the fourth capacitor C4 is transferred to the fifth capacitor C5. The charge transferred to the fifth capacitor C5 is expressed by (Vslew2−Vref)·C4. Therefore, an output voltage of the first differential amplifier 4b decreases by an amount of (Vslew2−Vref)·C4/Cinteg.

Since a polarity is reversed in the integrator configured by the first differential amplifier 4b and the fifth capacitor C5, the next stage of the integrator is provided with an inverting amplifier including the second differential amplifier 4c, the third resistance element R3, and the fourth resistance element R4. By passing an output signal of the integrator through the inverting amplifier, the polarity returns to the original polarity.

The error amplifier 4a having the integrator and the inverting amplifier has a function of integrating each of a differential voltage between a voltage Vslew1 and the reference voltage and a differential voltage between the voltage Vslew2 and the reference voltage. In this way, accuracy and stability of a control loop can be improved by providing an integrating function to the error amplifier 4a, instead of causing the error amplifier 4a to output a simple differential voltage between signals as the error voltage Verr.

The third resistance element R3 is connected between an output node of the first differential amplifier 4b and an inverting input node of the second differential amplifier 4c. The fourth resistance element R4 is connected between the inverting input node and the output node of the second differential amplifier 4c. The reference voltage is inputted to the non-inverting input node of the first differential amplifier 4b and a non-inverting input node of the second differential amplifier 4c.

The accumulated charge of the third capacitor C3 in the transition time detection circuit 3 is transferred to the fifth capacitor C5 in the error amplifier 4a when the first period selection signal Integ1 is high. Similarly, the accumulated charge of the fourth capacitor C4 in the transition time detection circuit 3 is transferred to the fifth capacitor C5 in the error amplifier 4a when the second period selection signal Integ2 is high.

The transition time control circuit 5 includes a third current source 16, a sixth capacitor C6, a third comparator 17, and a sixth switch SW6. Between the power supply voltage node and the ground node, the third current source 16 and the sixth capacitor C6 are connected in series. In the sixth capacitor C6, a charge corresponding to a current from the third current source 16 is accumulated in proportion to time. Therefore, a voltage on one end side of the sixth capacitor C6 becomes a sawtooth voltage. The sixth switch SW6 is connected in parallel to the sixth capacitor C6. The sixth switch SW6 is turned OFF when the reset signal Reset is high, and turned ON when the reset signal Reset is low. When the sixth switch SW6 is turned OFF, a sawtooth voltage corresponding to the accumulated charge of the sixth capacitor C6 is inputted to the third comparator 17. When the sixth switch SW6 is turned ON, the accumulated charge in the sixth capacitor C6 is discharged. During a period in which the reset signal Reset is high, the third comparator 17 compares the sawtooth voltage with the error voltage Verr, and outputs a signal corresponding to a differential voltage between both voltages.

The third current source 16 and the sixth capacitor C6 are included in a sawtooth voltage generation circuit 5a. The third comparator 17 may be a first timing detection circuit 5b.

A second logic circuit 5c outputs a signal corresponding to the input signal Vin, the output signal of the second comparator 12, and the output signal of the third comparator 17. The output signal of the second logic circuit 5c transitions from low to high at a rising timing of the input signal Vin, transitions from high to low at the timing when coincidence between the sawtooth voltage and the error voltage Verr is detected by the third comparator 17, and transitions from low to high at the timing when coincidence between the divided voltage Vd_div and VrefL is detected by the second comparator 12. The output signal of the second logic circuit 5c is inputted to the second buffer amplifier A2, and a second pulse signal V2 is generated by the second buffer amplifier A2.

Figure 5:
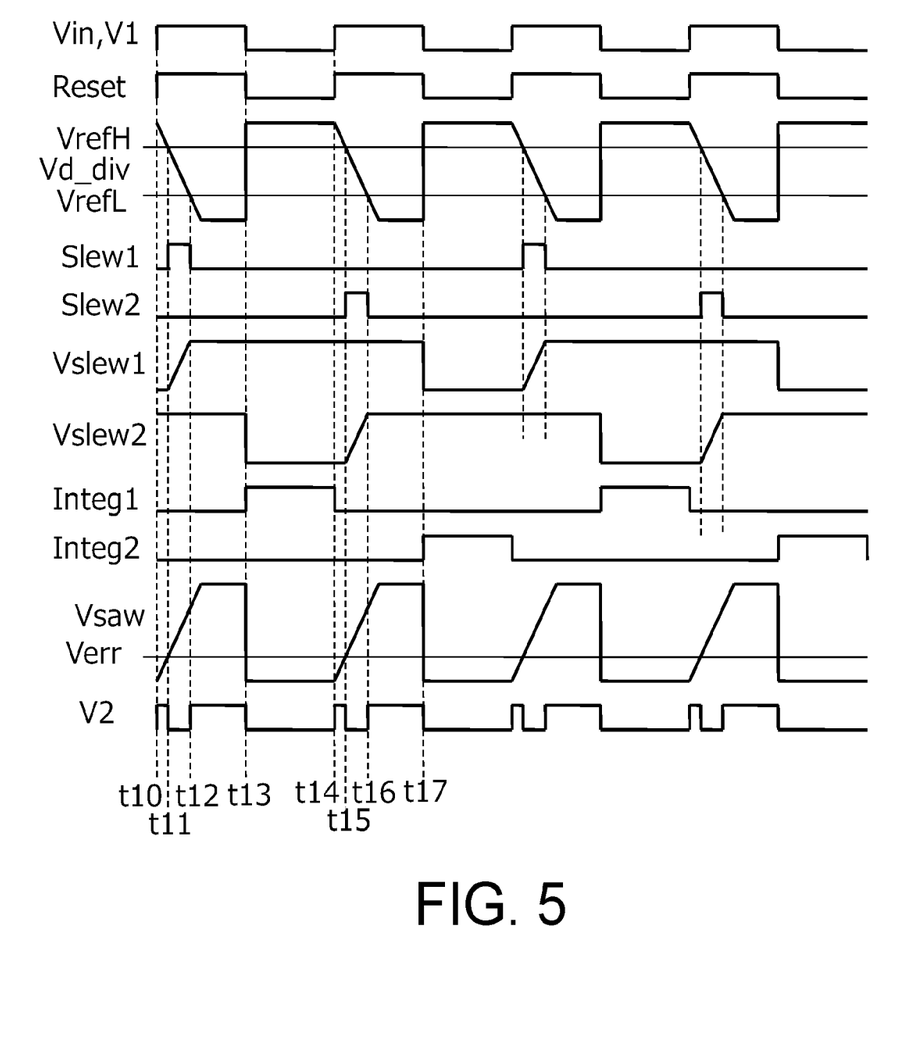
FIG. 5 is a timing chart of each part in the gate control circuit of FIG. 4.

FIG. 5 is a timing chart of each part in the gate control circuit 1 of FIG. 4. Hereinafter, an operation of the gate control circuit 1 of FIG. 4 will be described with reference to FIG. 5. First, at a time t10, when the input signal Vin transitions from low to high, a first pulse signal V1 also transitions to high. Further, the clock generating circuit 9 outputs the reset signal Reset having the same phase as the input signal Vin, and sets, alternately for each period of the input signal Vin, the first period selection signal Integ1 and the second period selection signal Integ2 to high for half period. Since the drain voltage Vd of the switching transistor M1 starts to gradually decrease after the time t10, the divided voltage Vd_div by the first capacitor C1 and the second capacitor C2 also starts to gradually decrease.

The first comparator 11 in the transition time detection circuit 3 outputs a signal indicating whether or not the divided voltage Vd_div is coincident with VrefH, and the second comparator 12 outputs a signal indicating whether or not the divided voltage Vd_div is coincident with VrefL. The first logic circuit 13 alternately outputs the signal Slew1 and the signal Slew2 indicating whether or not the divided voltage Vd_div is within a voltage range between VrefH and VrefL, for each period of the input signal Vin. Since the divided voltage Vd_div falls within the voltage range between VrefH and VrefL during a period between times t11 and t12 in FIG. 5, the signal Slew1 becomes high during this period.

Pulse widths of the signals Slew1 and Slew2 change in accordance with a time width required from when the divided voltage Vd_div coincides with VrefH until when the divided voltage Vd_div coincides with VrefL.

The second switch SW2 is turned ON or OFF by the signal Slew1, and the third switch SW3 is turned ON or OFF by the signal Slew2. This causes, alternately for each period of the input signal Vin, the third capacitor C3 to accumulate charges corresponding to the pulse width of the signal Slew1, or the fourth capacitor C4 to accumulate charges corresponding to the pulse width of the signal Slew2. As a result, from one end of the third capacitor C3 and one end of the fourth capacitor C4, the voltages Vslew1 and Vslew2 corresponding to the time from when the divided voltage Vd_div coincides with VrefH until when the divided voltage Vd_div coincides with VrefL are alternately outputted for each period of the input signal Vin. By interleaving and outputting the voltage Vslew1 and the voltage Vslew2 in this manner, the operation timing of each part in the gate control circuit 1 can be synchronized with the input signal Vin, eliminating necessity of a clock signal with a higher frequency than the input signal Vin.

The voltage Vslew1 increases with a slope determined by a current flowing through the first current source 14 and a capacitance of the third capacitor C3. Similarly, the voltage Vslew2 increases with a slope determined by a current flowing through the second current source 16 and a capacitance of the fourth capacitor C4.

The voltage Vslew1 and the voltage Vslew2 are inputted to the error amplifier 4a. Between the times t11 and t12, the integrator in the error amplifier 4a inverts and integrates a differential voltage between the voltage Vslew1 and the reference voltage, and the inverting amplifier in the error amplifier 4a returns the output signal of the integrator to the original logic, to generate the error voltage Verr. The error voltage Verr has a larger voltage value as the pulse width of the voltage Vslew1 and the signal Slew2 is longer.

The third comparator 17 in the transition time control circuit 5 detects whether or not the sawtooth voltage generated by the third current source 16 and the sixth capacitor C6 is coincident with the error voltage Verr. As the error voltage Verr increases, the timing at which coincidence is detected by the third comparator 17 is delayed. The example of FIG. 5 shows an example in which the third comparator 17 detects the coincidence at the time t11. The second logic circuit 5c causes transition of the second pulse signal V2 from low to high at the time t10. Thereafter, at the time t11 when the third comparator 17 detects coincidence, the second pulse signal V2 transitions from high to low. Thereafter, the second pulse signal V2 transitions from low to high at the time t12 when the second comparator 12 detects coincidence of the divided voltage Vd_div and VrefL. Thereafter, at a time t13 when the input signal Vin transitions from high to low, the second pulse signal V2 transitions from high to low. Thereafter, between times t14 to t17, a similar operation is performed in accordance with the pulse width of the signal Slew2.

As described above, in the third embodiment, the gate control circuit 1 can be realized by a process with a low withstand voltage since the second pulse signal V2 is generated on the basis of the divided voltage Vd_div obtained by dividing the drain voltage Vd by a capacitance ratio between the first capacitor C1 and the second capacitor C2, instead of using the drain voltage Vd of the switching transistor M1 as it is. Further, the signal Slew1 and the signal Slew2 having pulse widths corresponding to the time from when the divided voltage Vd_div coincides with VrefH until when the divided voltage Vd_div coincides with VrefL are alternately generated for each period of the input signal Vin, the voltage Vslew1 is generated corresponding to the signal Slew1, and the voltage Vslew2 is generated corresponding to the signal Slew2. This allows the voltages Vslew1 and Vslew2 to be alternately interleaved and outputted for each period of the input signal Vin, eliminating necessity of inputting a clock signal having a higher frequency than the input signal Vin. Further, the error voltage Verr is generated by integrating the differential voltage between the voltage Vslew1 or the voltage Vslew2 and the reference voltage, and the second pulse signal V2 is generated on the basis of the timing at which the sawtooth voltage coincides with the error voltage Verr, the input signal and the timing at which Vin and the divided voltage Vd_div coincide with VrefL. This enables adjustment of the timing at which the second pulse signal V2 transitions from high to low for the first time, in accordance with the voltage value of the error voltage Verr.

According to the third embodiment, as the transition time of the drain voltage Vd of the switching transistor M1 is longer, the voltages Vslew1 and Vslew2 become larger, the error voltage Verr increases, and the timing at which the error voltage Verr coincides with the sawtooth voltage is delayed. Consequently, the timing at which the second pulse signal V2 transitions from high to low for the first time is delayed, and the feedback control is performed in a direction in which the transition time of the drain voltage Vd is shortened. In this way, by using the gate control circuit 1 of FIG. 4, the transition time of the drain voltage Vd can be kept constant, and the transition time can be optionally adjusted with the reference voltage inputted to the error amplifier 4a.

Fourth Embodiment

A gate control circuit 1 according to a fourth embodiment is obtained by embodying the circuit configuration of the gate control circuit 1 according to the second embodiment.

Figure 6:
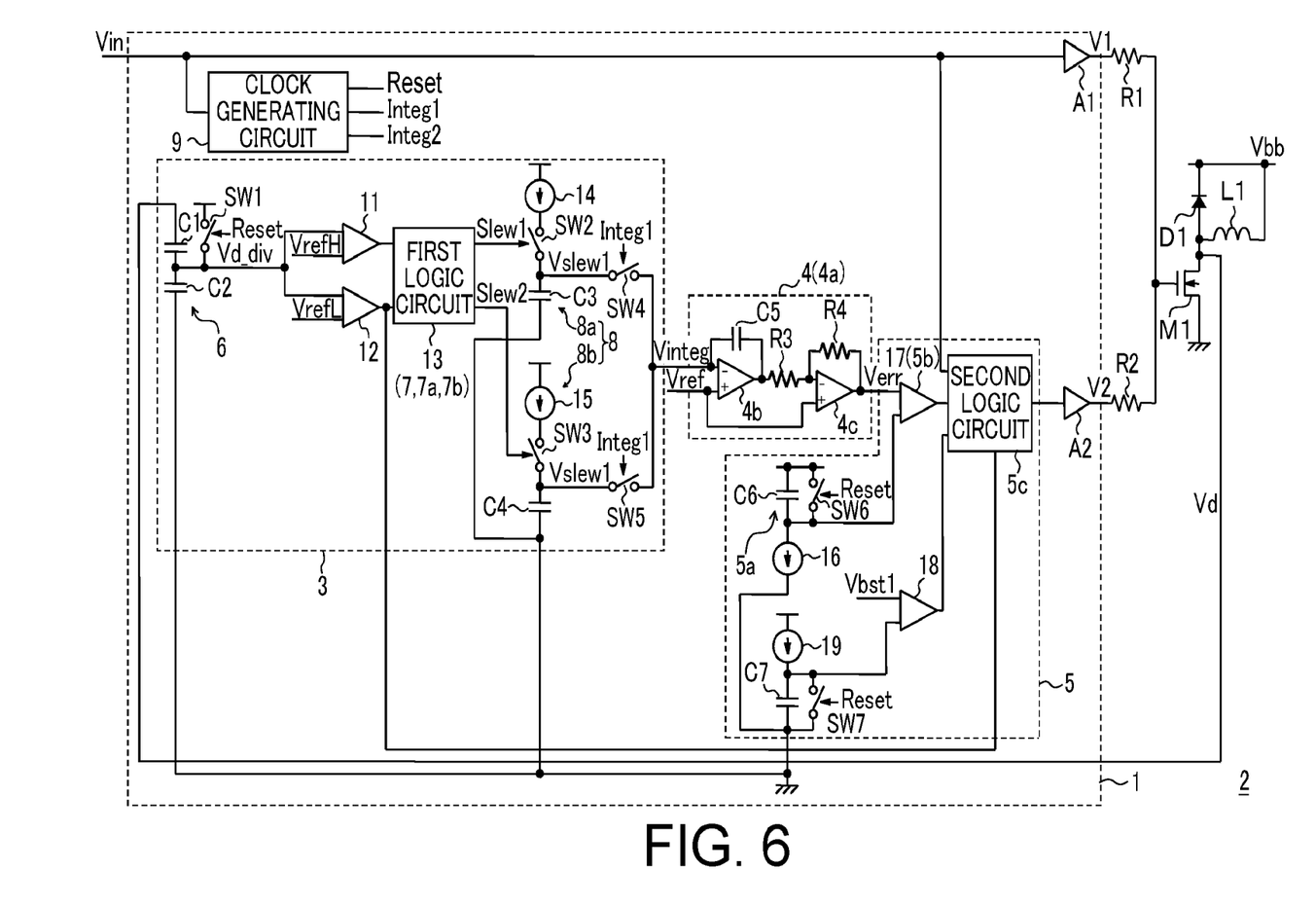
FIG. 6 is a circuit diagram of a power supply circuit including a gate control circuit according to a fourth embodiment.
Figure 7:
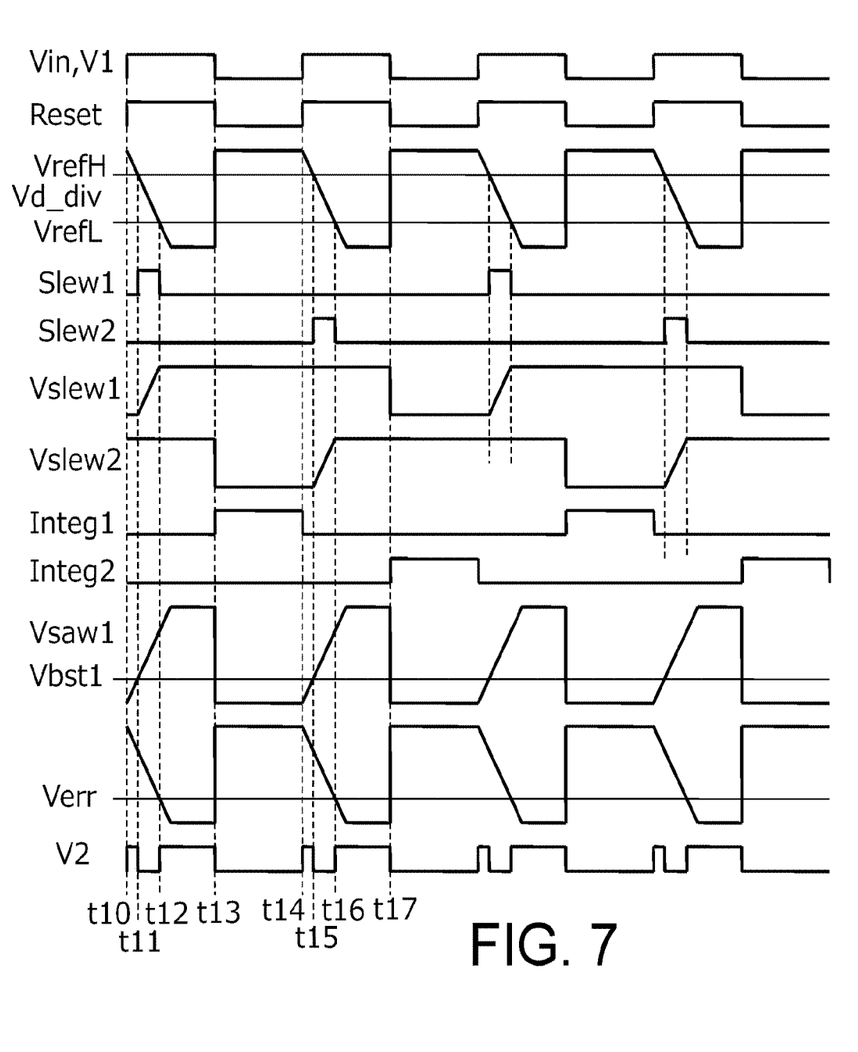
FIG. 7 is a timing chart of each part in the gate control circuit of FIG. 6.

FIG. 6 is a circuit diagram of a power supply circuit 2 including the gate control circuit 1 according to the fourth embodiment, and FIG. 7 is a timing chart of each part in the gate control circuit 1 of FIG. 6. In FIG. 6, the same reference numerals are given to the circuit components common to those in FIG. 4, and the following description mainly focuses on the differences.

The gate control circuit 1 of FIG. 6 has a circuit configuration similar to that of FIG. 4, except that some circuit configurations in a transition time control circuit 5 are different from those of FIG. 4. The transition time control circuit 5 of FIG. 6 includes a third comparator 17 similar to the transition time control circuit 5 of FIG. 4, a sixth capacitor C6, a sixth switch SW6, and a third current source 16, and in addition to these, includes a fourth comparator 18, a seventh capacitor C7, a seventh switch SW7, and a fourth current source 19. The fourth comparator 18 corresponds to the second timing detection circuit.

The sixth capacitor C6 and the third current source 16 in FIG. 6 are connected in series between a power supply voltage node and a ground node. To the third comparator 17, a sawtooth voltage of a connection node between the sixth capacitor C6 and the third current source 16 is inputted. A waveform of the sawtooth voltage of the connection node between the sixth capacitor C6 and the third current source 16 in FIG. 6 is opposite to the waveform of the sawtooth voltage in FIG. 4. In the gate control circuit 1 of FIG. 4, the timing at which the second pulse signal V2 transitions from high to low for the first time is set by the output signal of the third comparator 17. However, in a second logic circuit 5c in FIG. 6, the timing at which a second pulse signal V2 transitions from low to high for the second time is set by an output signal of the third comparator 17. When a transition time of a drain voltage Vd of a switching transistor M1 becomes longer and an error voltage Verr becomes larger, since the third comparator 17 detects coincidence between the sawtooth voltage and the error voltage Verr more quickly, the timing at which the second pulse signal V2 becomes high for the second time becomes earlier. This causes feedback control to be performed so as to shorten the transition time of the drain voltage Vd.

The seventh switch SW7 is turned OFF when a reset signal Reset is high, and turned ON when the reset signal Reset is low. When the seventh switch SW7 is turned OFF, a current corresponding to an accumulated charge of the seventh capacitor C7 flows to the fourth current source 19. This causes the voltage at a connection node between the seventh capacitor C7 and the fourth current source 19 to become a sawtooth voltage. This sawtooth voltage is inputted to the fourth comparator 18. The fourth comparator 18 detects whether or not the sawtooth voltage is coincident with a predetermined specified voltage.

The second logic circuit 5c sets the timing at which the second pulse signal V2 transitions to low for the first time, at the timing when coincidence is detected by the fourth comparator 18.

As described above, in the fourth embodiment, the third comparator 17 is provided in the transition time control circuit 5 to adjust the timing at which the second pulse signal V2 transitions from low to high for the second time in accordance with the transition time of the drain voltage Vd, and the fourth comparator 18 is provided to set the timing at which the second pulse signal V2 transitions from high to low for the first time to a predetermined specified time. Therefore, it is possible to optimize the transition time of the drain voltage Vd, similarly to the third embodiment.

Fifth Embodiment

The gate control circuit 1 according to the first to fourth embodiments described above can be provided inside a boost converter or a step-down converter.

Figure 8:
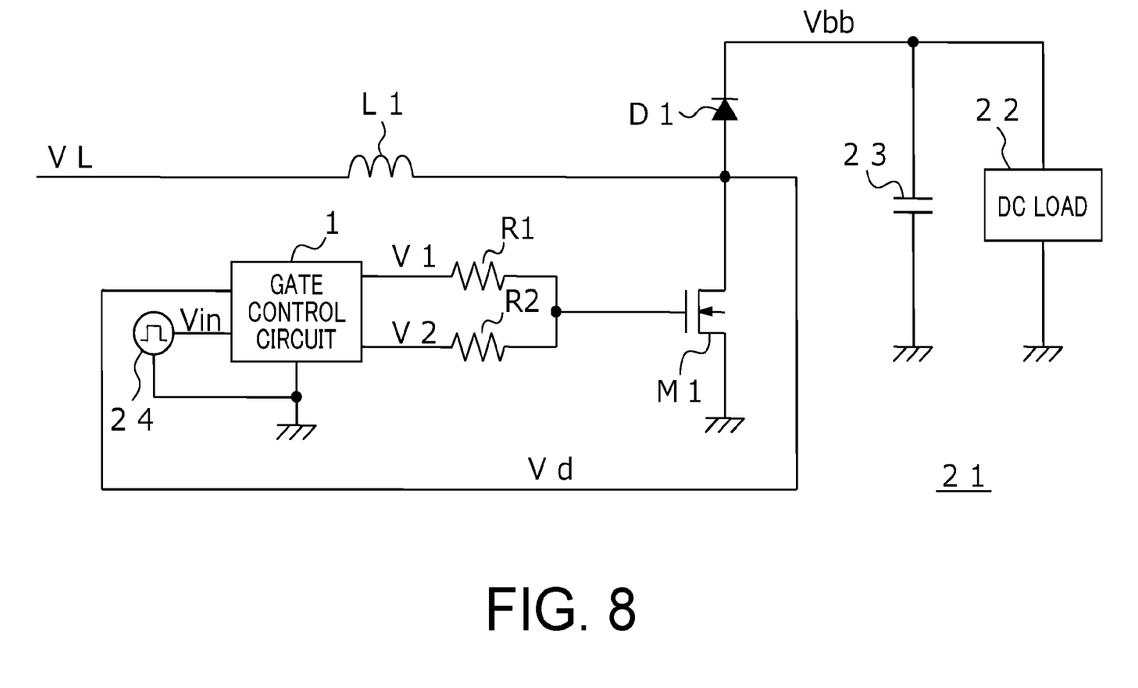
FIG. 8 is a block diagram of a boost converter internally including the gate control circuit according to the first to fourth embodiments.

FIG. 8 is a block diagram of a boost converter 21 internally including the gate control circuit 1 according to the first to fourth embodiments. The boost converter 21 in FIG. 8 includes the above-described gate control circuit 1, a first resistance element R1, a second resistance element R2, a switching transistor M1, and a diode D1, and includes a step-up inductor L1 in addition to those. Further, to a cathode of the diode D1, a DC load 22 and a capacitor 23 are connected in parallel.

To the gate control circuit 1, a pulse signal from a pulse source 24 is inputted as an input signal Vin. The switching transistor M1, the diode D1, and the inductor L1 are included in the boost converter 21. An input DC voltage VL is supplied to one end of the inductor L1. The inductor L1 makes conversion to a DC voltage VH higher than the input DC voltage VL, and supplies the DC voltage VH to the DC load 22. The capacitor 23 connected in parallel to the DC load 22 is a smoothing capacitor and reduces a ripple of the DC voltage VH.

By feeding back a drain voltage Vd of the switching transistor M1 to a transition time detection circuit 3 in the gate control circuit 1, a slew rate of the drain voltage Vd of the switching transistor M1 can be optimized also in the boost converter 21 of FIG. 8, similarly to the first to fourth embodiments.

Sixth Embodiment

The gate control circuit 1 according to the first to fourth embodiments described above can be applied to an inverter circuit such as a three-phase inverter circuit.

Figure 9:
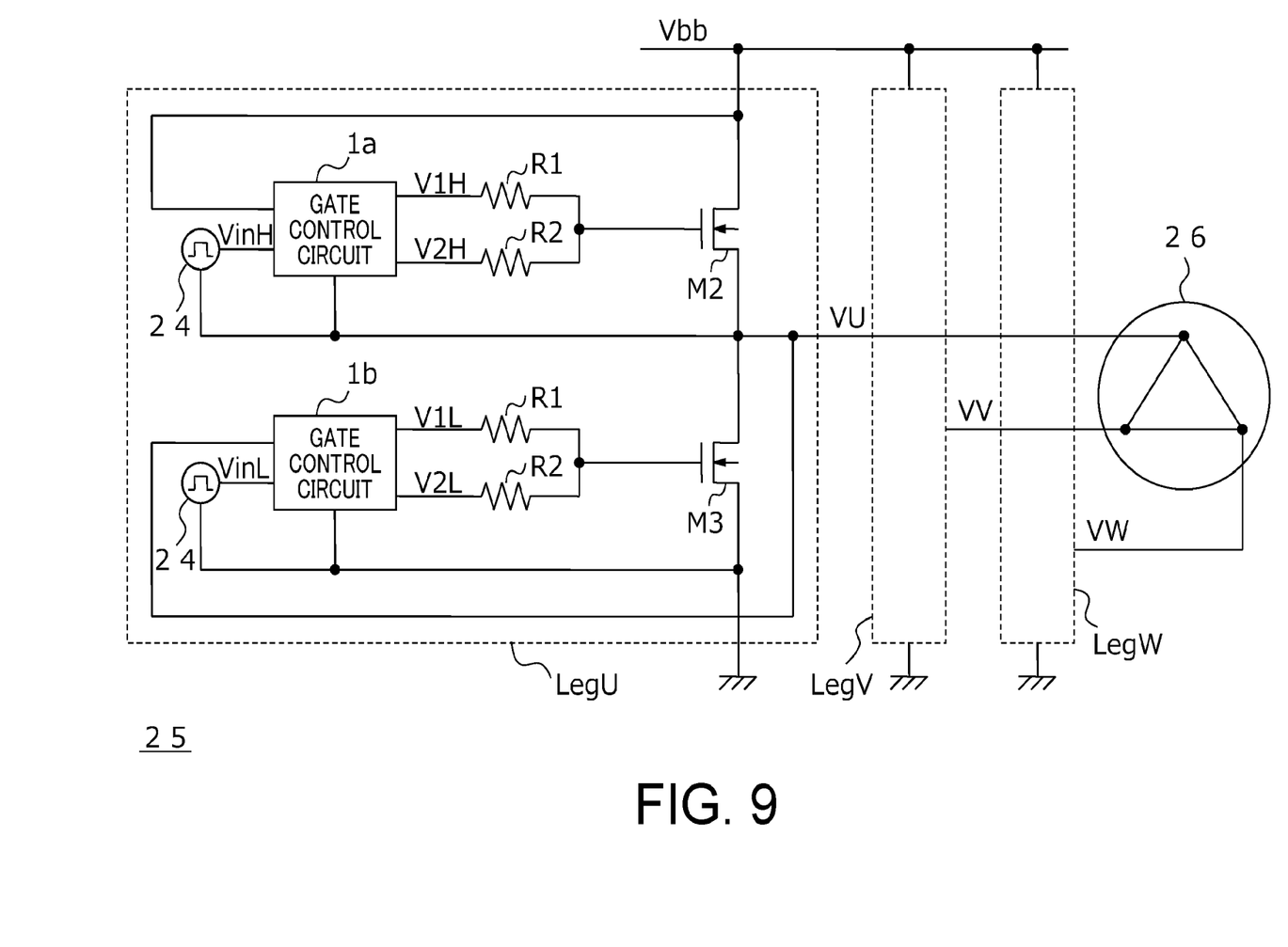
FIG. 9 is a block diagram of a three-phase inverter circuit internally including the gate control circuit according to the first to fourth embodiments.

FIG. 9 is a block diagram of a three-phase inverter circuit 25 internally including the gate control circuit 1 according to the first to fourth embodiments. The three-phase inverter circuit 25 is a circuit to generate drive signals VU, VV, and VW of a three-phase motor 26. The three-phase inverter circuit 25 of FIG. 9 has three legs LegU, LegV, and LegW having the same configuration, and each leg generates one of the drive signals VU, VV, or VW.

To each leg, a DC bus voltage Vbb is supplied. Each leg outputs one of drive voltages VU, VV, or VW through a low side transistor M2 and a high side transistor M3 performing ON or OFF operation.

In the following, an internal configuration of the leg LegU will be explained, but internal configurations and operations of other legs LegV and LegW are similar to those of the leg LegU.

The leg LegU has a gate control circuit 1a connected to a gate of the high side transistor M2, and a gate control circuit 1b connected to a gate of the low side transistor M3. The gate control circuit 1b connected to the gate of the low side transistor M3 operates with a ground node as a reference, and an input pulse VinL with the ground node as a reference is supplied from a pulse source 24.

The low side transistor M3 and the high side transistor M2 are connected in series, and a voltage of a connection node of both transistors M2 and M3 is the output voltage VU of the leg LegU. The output voltage VU is fed back to the gate control circuit 1b on the low side of the leg LegU. The gate control circuit 1b on the low side performs feedback control such that a slew rate of the output voltage VU becomes constant.

The gate control circuit 1a on the high side operates with the output voltage VU of the leg LegU as a reference, and an input pulse VinH based on the output voltage VU is supplied from a pulse source 24. The bus voltage Vbb is fed back to the high side gate control circuit 1a. The gate control circuit 1a on the high side performs feedback control such that a slew rate of a voltage between a drain and a source (Vbb−VU) of the high side transistor M2 becomes constant.

In this way, by connecting the gate control circuit 1 according to the first to fourth embodiments to each of the gates of the six transistors that configure the three-phase inverter circuit 25, it is possible to optimize the slew rate of the voltage between the drain and the source of all the transistors.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A gate control circuit comprising:
   a transition time detection circuit configured to detect a transition time of a drain voltage of a switching transistor that is turned ON or OFF by a gate voltage corresponding to a first pulse signal and a second pulse signal which are supplied to a gate of the switching transistor;
   an error detection circuit configured to output an error voltage representing a difference voltage between a voltage representing the transition time and a voltage representing a predetermined target transition time; and
   a transition time control circuit configured to generate the second pulse signal based on the error voltage and the first pulse signal corresponding to an input signal that instructs ON or OFF of the switching transistor.

2. The gate control circuit according to claim 1, further comprising:
   a first terminal to which the input signal is inputted;
   a second terminal which outputs the first pulse signal supplied to the gate;
   a third terminal which outputs the second pulse signal supplied to the gate; and
   a fourth terminal to which a drain voltage of the switching transistor is inputted.

3. The gate control circuit according to claim 1, wherein the transition time control circuit controls, in accordance with the error voltage, a timing for causing the second pulse signal to fall for a first time after raising the second pulse signal in synchronization with a rising edge of the first pulse signal.

4. The gate control circuit according to claim 3, wherein the transition time control circuit controls, in accordance with the drain voltage, a timing for raising the second pulse signal for a second time after causing the second pulse signal to fall for a first time.

5. The gate control circuit according to claim 1, wherein the transition time control circuit controls, in accordance with the error voltage, a timing for raising the first pulse signal for a second time after raising the second pulse signal in synchronization with a rising edge of the first pulse signal and then causing the second pulse signal to fall for a first time after a predetermined period of time has elapsed.

6. The gate control circuit according to claim 1, wherein the transition time detection circuit comprises
   a voltage dividing circuit configured to divide a drain voltage of the switching transistor by a capacitance ratio of a plurality of capacitors,
   a pulse generating circuit configured to output a pulse signal indicating that an output voltage of the voltage dividing circuit is within a predetermined voltage range, and
   a time-voltage conversion circuit configured to output a voltage corresponding to a pulse width of the pulse signal; and
   the error detection circuit outputs the error voltage corresponding to a difference between a voltage outputted from the time-voltage conversion circuit and a reference voltage corresponding to the target transition time.

7. The gate control circuit according to claim 6, wherein the pulse generating circuit comprises
a first transition detection unit configured to output a first transition detection signal indicating that an output voltage of the voltage dividing circuit is within a predetermined voltage range when the first pulse signal outputs an odd-numbered pulse signal, and a second transition detection unit configured to output a second transition detection signal indicating that an output voltage of the voltage dividing circuit is within a predetermined voltage range when the first pulse signal outputs an even-numbered pulse signal;
the time-voltage conversion circuit comprises
a first time-voltage conversion circuit configured to output a first voltage corresponding to a pulse width of the first transition detection signal, and
a second time-voltage conversion circuit configured to output a second voltage corresponding to a pulse width of the second transition detection signal; and
the error detection circuit outputs the error voltage corresponding to a difference between the first and the second voltages and the reference voltage.

8. The gate control circuit according to claim 1, wherein the transition time control circuit comprises:
a sawtooth voltage generation circuit configured to output a sawtooth voltage;
a first timing detection circuit configured to detect a timing at which the error voltage coincides with the sawtooth voltage; and
a logic circuit configured to determine a timing at which the second pulse signal rises for a second time, based on a timing at which the error voltage coincides with the sawtooth voltage.

9. The gate control circuit according to claim 8, wherein the transition time control circuit comprises
a second timing detection circuit configured to detect a timing at which a reference voltage being predetermined coincides with the sawtooth voltage; and
the logic circuit determines a timing at which the second pulse signal falls for a first time, based on a timing at which the reference voltage coincides with the sawtooth voltage.

10. A power supply circuit comprising:
a gate control circuit configured to output a first pulse signal and a second pulse signal;
a switching transistor configured to be turned ON or OFF by a gate voltage corresponding to the first pulse signal and the second pulse signal; and
a diode in which an anode is connected to a drain of the switching transistor and a load is connected to a cathode side,
wherein the gate control circuit comprises:
a transition time detection circuit configured to detect a transition time of a drain voltage of the switching transistor that is turned ON or OFF by a gate voltage corresponding to the first pulse signal and the second pulse signal which are supplied to a gate of the switching transistor;
an error detection circuit configured to output an error voltage representing a difference voltage between a voltage representing the transition time and a voltage representing a predetermined target transition time; and
a transition time control circuit configured to generate the second pulse signal based on the error voltage and the first pulse signal corresponding to an input signal that instructs ON or OFF of the switching transistor.

11. The power supply circuit according to claim 10, wherein the gate control circuit further comprises:
a first terminal to which the input signal is inputted;
a second terminal which outputs the first pulse signal supplied to the gate;
a third terminal which outputs the second pulse signal supplied to the gate; and
a fourth terminal to which a drain voltage of the switching transistor is inputted.

12. The power supply circuit according to claim 10, wherein
the transition time control circuit controls, in accordance with the error voltage, a timing for causing the second pulse signal to fall for a first time after raising the second pulse signal in synchronization with a rising edge of the first pulse signal.

13. The power supply circuit according to claim 12, wherein
the transition time control circuit controls, in accordance with the drain voltage, a timing for raising the second pulse signal for a second time after causing the second pulse signal to fall for a first time.

14. The power supply circuit according to claim 10, wherein
the transition time control circuit controls, in accordance with the error voltage, a timing for raising the first pulse signal for a second time after raising the second pulse signal in synchronization with a rising edge of the first pulse signal and then causing the second pulse signal to fall for a first time after a predetermined period of time has elapsed.

15. The power supply circuit according to claim 10, wherein
the transition time detection circuit comprises
a voltage dividing circuit configured to divide a drain voltage of the switching transistor by a capacitance ratio of a plurality of capacitors,
a pulse generating circuit configured to output a pulse signal indicating that an output voltage of the voltage dividing circuit is within a predetermined voltage range, and
a time-voltage conversion circuit configured to output a voltage corresponding to a pulse width of the pulse signal; and
the error detection circuit outputs the error voltage corresponding to a difference between a voltage outputted from the time-voltage conversion circuit and a reference voltage corresponding to the target transition time.

16. The power supply circuit according to claim 15, wherein
the pulse generating circuit comprises
a first transition detection unit configured to output a first transition detection signal indicating that an output voltage of the voltage dividing circuit is within a predetermined voltage range when the first pulse signal outputs an odd-numbered pulse signal, and a second transition detection unit configured to output a second transition detection signal indicating that an output voltage of the voltage dividing circuit is within a predetermined voltage range when the first pulse signal outputs an even-numbered pulse signal;
the time-voltage conversion circuit comprises
a first time-voltage conversion circuit configured to output a first voltage corresponding to a pulse width of the first transition detection signal, and a second time-voltage conversion circuit configured to output a second voltage corresponding to a pulse width of the second transition detection signal; and the error detection circuit outputs the error voltage corresponding to a difference between the first and the second voltages and the reference voltage.

17. The power supply circuit according to claim 10, wherein the transition time control circuit comprises:

a sawtooth voltage generation circuit configured to output a sawtooth voltage;

a first timing detection circuit configured to detect a timing at which the error voltage coincides with the sawtooth voltage; and a logic circuit configured to determine a timing at which the second pulse signal rises for a second time, based on a timing at which the error voltage coincides with the sawtooth voltage.

18. The power supply circuit according to claim 17, wherein the transition time control circuit comprises a second timing detection circuit configured to detect a timing at which a reference voltage being predetermined coincides with the sawtooth voltage; and the logic circuit determines a timing at which the second pulse signal falls for a first time, based on a timing at which the reference voltage coincides with the sawtooth voltage.

19. An inverter circuit comprising a motor with a plurality of phases, and a plurality of power supply circuits provided for each phase of the motor and configured to individually generate currents of corresponding phases, wherein each of the plurality of power supply circuits comprises a gate control circuit configured to output a first pulse signal and a second pulse signal, and a switching transistor configured to be turned ON or OFF by a gate voltage corresponding to the first pulse signal and the second pulse signal, wherein the gate control circuit comprises:

a transition time detection circuit configured to detect a transition time of a drain voltage of the switching transistor that is turned ON or OFF by a gate voltage corresponding to the first pulse signal and the second pulse signal which are supplied to a gate of the switching transistor:

an error detection circuit configured to output an error voltage representing a difference voltage between a voltage representing the transition time and a voltage representing a predetermined target transition time; and a transition time control circuit configured to generate the second pulse signal based on the error voltage and the first pulse signal corresponding to an input signal that instructs ON or OFF of the switching transistor.

20. The inverter circuit according to claim 19, wherein the gate control circuit further comprises:

a first terminal to which the input signal is inputted;

a second terminal which outputs the first pulse signal supplied to the gate:

a third terminal which outputs the second pulse signal supplied to the gate: and a fourth terminal to which a drain voltage of the switching transistor is inputted.

* * * * *